United States Patent [19]
Bird

[11] Patent Number: 5,945,663
[45] Date of Patent: Aug. 31, 1999

[54] CHARGE MEASUREMENT CIRCUIT WHICH INCLUDES A CHARGE SENSITIVE AMPLIFIER HOLDING INPUT TO A CONSTANT VOLTAGE

[75] Inventor: Neil C. Bird, Horley, United Kingdom

[73] Assignee: U.S. Philips Corporation, New York, N.Y.

[21] Appl. No.: 08/938,919

[22] Filed: Sep. 26, 1997

[30] Foreign Application Priority Data

Oct. 4, 1996 [GB] United Kingdom .................. 9620762

[51] Int. Cl.⁶ .................................................. H01J 40/14
[52] U.S. Cl. ........................ 250/208.1; 348/308; 348/311
[58] Field of Search ........................ 250/208.1; 348/300, 348/302, 303, 304, 308, 311

[56] References Cited

U.S. PATENT DOCUMENTS

| 5,572,015 | 11/1996 | Bird et al. | 250/208.1 |
| 5,608,205 | 3/1997 | Bird et al. | 348/311 |
| 5,721,422 | 2/1998 | Bird | 348/308 |
| 5,856,666 | 1/1999 | Moulsley | 250/208.1 |

FOREIGN PATENT DOCUMENTS 2179814  3/1987  United Kingdom .............. H03F 3/45

Primary Examiner—Stephone Allen
Attorney, Agent, or Firm—Steven R. Biren

[57] ABSTRACT

A charge measurement circuit 20 includes a charge sensitive amplifier 40 which holds the input 42 at a constant voltage. A compensation circuit 72, 74, 76, 80 enables a current to be supplied to or drained from a charge supplying circuit 32. This current is selected such that any voltage mismatch between the output of the supplying circuit 32 and the input 42 of the measurement circuit 20 does not result in a charge flow which causes errors in the measured signal.

9 Claims, 2 Drawing Sheets

CHARGE MEASUREMENT CIRCUIT WHICH INCLUDES A CHARGE SENSITIVE AMPLIFIER HOLDING INPUT TO A CONSTANT VOLTAGE

This invention relates to a charge measurement circuit and is concerned particularly, but not exclusively, with a charge measurement circuit for reading the signals from an array of photosensitive pixels of an image sensor.

It is known to provide column multiplexers for reading signals from columns of pixels of an image sensor (or other device comprising an array of charge producing pixels). A column multiplexer generally comprises an array of switches, each switch being associated with an individual column, and with a group of switches being associated with a signal reading device. One switch of the group transfers a charge from the respective column to the signal reading device. The problem can arise that when the multiplexer switches are activated by voltage control levels, the voltage at the output of a multiplexer switch may not be matched with a voltage level at the input of the signal reading device. This is a particular problem when the signal reading device is for the measurement of the flow of charge, because any voltage mismatch results in an additional charge flow which gives rise to errors in the measured signal.

These errors are reduced by ensuring that the charge providing circuit and the measurement circuit have the lowest possible offset voltages and thermal drift. For example, GB 2 179 814 discloses a sample and hold circuit (which may be considered as a switch which provides a signal for measurement) with an operational amplifier for providing a sampled output, the amplifier having low output impedance and low input offset voltage. However, there is no compensation for any remaining voltage offsets or other signal errors, which can cause errors in the sampled output.

According to the present invention, there is provided a charge measurement circuit for measuring the charge flowing from the output of a charge supplying circuit to an input of the charge measurement circuit, the measurement circuit including a charge sensitive amplifier which holds the input to a predetermined substantially constant voltage and compensation means for supplying a compensation current to or draining a compensation current from the input, the compensation current being selected such that charge flowing as a result of a voltage mismatch between the output of the charge supplying circuit and the input of the charge measurement circuit is provided by the compensation means.

The compensation means of the invention enables any voltage offsets of the output of the charge supplying circuit and of the input of the charge measurement circuit to be compensated so that these offsets do not result in the measurement of charges unrelated to the signal which is to be measured. The voltage mismatch referred to above, and in the following text and claims, represents a difference between the isolated output voltage of the charge supplying circuit when there is no signal to be measured, and the predetermined substantially constant voltage (at which the input of the isolated charge measurement circuit is held). The isolated output voltage is the output voltage when the output is connected to an infinite impedance. This voltage difference would, in the absence of the compensation means, result in a flow of charge additional to the signal to be measured between the charge supplying circuit and the charge measurement circuit during signal measurement.

The compensation means preferably comprises a voltage controlled current source, which enables control of the compensation current.

The measurement circuit preferably has two modes of operation, a first mode in which the output of the charge sensitive amplifier is representative of the voltage mismatch and is used to generate a voltage control signal for the voltage controlled current source, and a second mode in which the voltage control signal is applied to the voltage controlled current source and the output of the charge sensitive amplifier is representative of the charge flowing to the input.

In this way, the compensation means is controlled by the charge measurement circuit, and this has the advantage that no additional connections are required between the charge supplying circuit and the charge measurement circuit. This is particularly advantageous when the charge supplying circuit comprises an array of image sensor pixels or other large array, because the number of connections to the array should be kept to a minimum.

To implement the two modes of operation, the charge sensitive amplifier may comprise an amplifier with capacitive feedback which can be selectively applied, the capacitive feedback being disconnected in the first mode so that the charge sensitive amplifier operates as an open loop voltage amplifier, and the capacitive feedback being connected in the second mode so that the charge sensitive amplifier operates to measure the flow of charge. The compensation means may comprise a transistor having a gate voltage which is controlled using the voltage control signal.

The compensation means preferably further comprises a track and hold circuit for holding the voltage control signal on the gate during the second mode of the charge measurement circuit.

When the charge supplying circuit comprises an array of pixels of an image sensor, the array may comprise rows and columns with each column being connected to the input of the measurement circuit through a respective multiplexer switch, so that charge supplied by an individual column of pixels can be supplied to a measurement circuit through the respective switch. The use of a multiplexer enables a reduction in the number of connections between the array of pixels and peripheral circuitry, such as the measurement circuits. The multiplexer switches may each comprise a diode bridge which is controlled by voltages applied to control terminals of the diode bridge. The voltage mismatch referred to above may result from offsets in these voltages applied to the control terminals as well as in differences in fabrication between diodes in the diode bridge.

The invention also provides an image sensor comprising an array of pixels arranged in rows and columns and a column multiplexer circuit comprising a plurality of switches, a switch being associated with each column, the image sensor further comprising a charge measurement circuit in accordance with the invention and associated with a plurality of switches.

The invention will now be described by way of example with reference to, and as shown in the accompanying drawings, in which.

Figure 2:
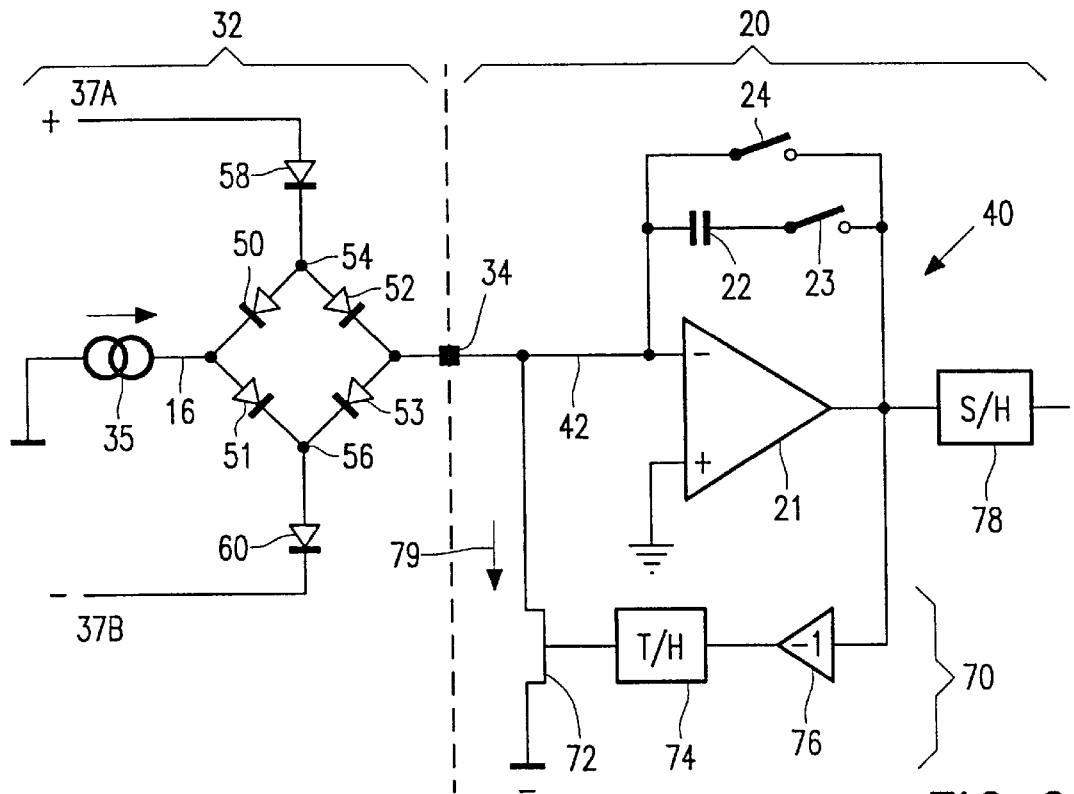
FIG. 2 shows a charge measurement circuit according to the invention for reading the signal output by a multiplexer switch.
Figure 3:
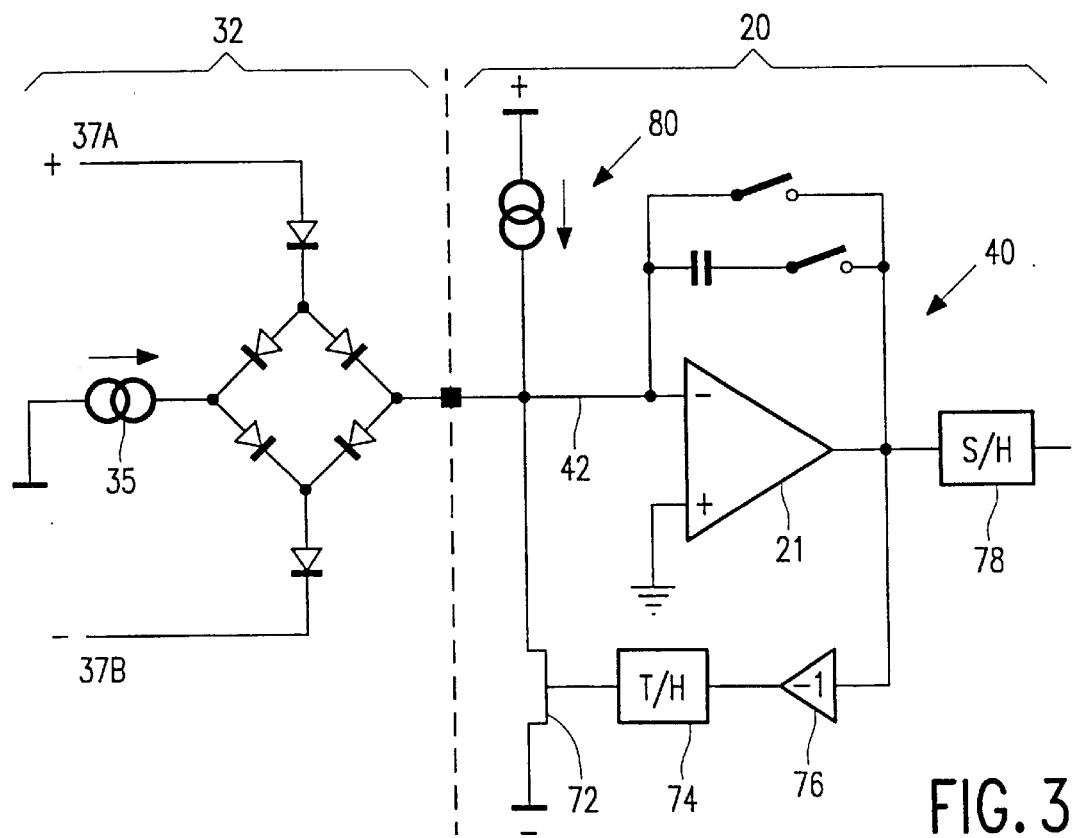
FIG. 3 corresponds to FIG. 2 and shows a modification to the charge measurement circuit.

The invention provides a charge measurement circuit 20 shown in FIG. 2 and 3 including a charge sensitive amplifier 40 and a current compensation circuit 70 which can drain a current from the input 42 of the charge sensitive amplifier 40

(FIG. 2) or can supply or drain a current to or from the input 42 (FIG. 3). In this way, any voltage mismatch between the charge sensitive amplifier 40 and the current supplying circuit 32 does not cause a resulting flow charge to be measured by the charge sensitive amplifier 40. In FIG. 2, the charge supplying circuit 32 comprises a multiplexer switch which selectively couples a column of pixels of an image sensor array to the input 42 of the charge sensitive amplifier. The column of pixels has been represented by a current source 35.

Figure 1:
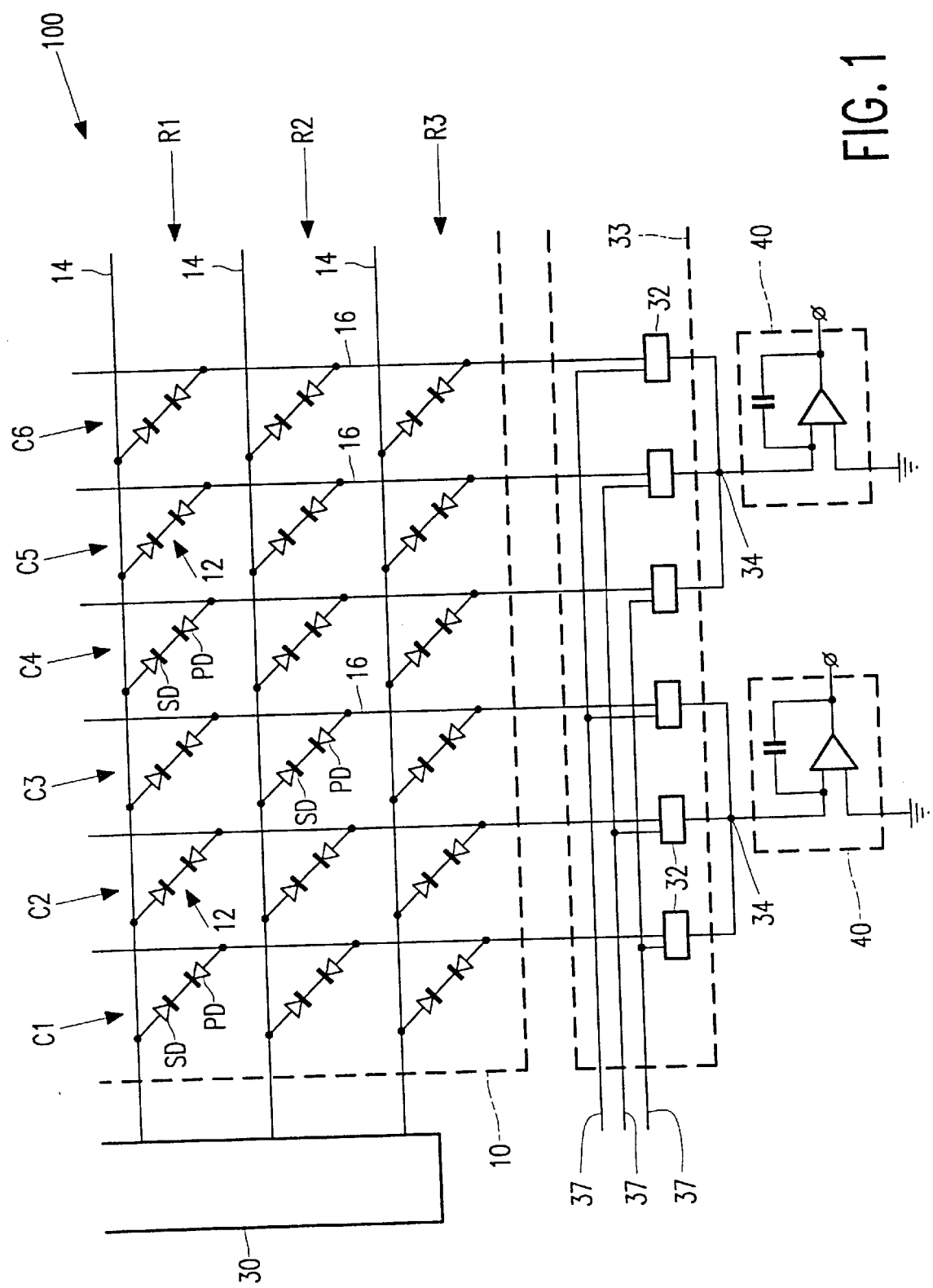
FIG. 1 shows a known image sensor configuration having a column multiplexer circuit.

FIG. 1 shows a known arrangement for an image sensor 100 comprising an array 10 of image sensing pixels 12. In FIG. 1, each image sensing pixel is represented as a switching diode SD in series with a photodiode PD connected between respective row conductors 14 and column conductors 16. The precise arrangement of each pixel 12 is not material to the present invention, and the various possibilities will therefore not be discussed in detail. Furthermore, although the invention is described in connection with an image sensor comprising an array of pixels, the invention is applicable to any device which provides a charge to be measured, and where the flow of charge may comprise a signal for measurement and a superimposed error signal resulting from mismatch between the measurement circuit and the charge producing circuit.

In the image sensor of FIG. 1, a row driver circuit 30 is provided for producing line-scan pulses which are applied sequentially to the row conductors 14, to address sequentially the rows of the array. These lines-scan pulses serve for forward biasing the switching diodes SD of the associated row, which enables charges stored on the photodiodes PD to flow to the associated column conductor 16 for subsequent measurement. The columns C of the array 10 are arranged in groups, such as group C1 to C3 and groups C4 to C6. Each such group has a respective common terminal 34. The column conductor 16 for each column is connected to an associated multiplexer switch 32 which couples the column conductor 16 to the common terminal 34. In this way, the multiplexer switches 32 transmit the signal from a selected column conductor through to the common terminal 34. In this way, the photo-generated charges from the photodiode PD of a selected row are transmitted to the column conductor 16, and are read by a charge sensitive amplifier 40 after switching through a respective multiplexer switch 32. The multiplexer switches 32 together form a column multiplexer circuit 33. As shown in FIG. 1, the multiplexer switches 32 each have associated voltage control lines 37 for controlling the switching of each multiplexer switch 32.

An individual charge sensitive amplifier 40 is associated with each common terminal 34 and reads, in turn, the signals on the columns 16 associated with that common terminal 34. The charge sensitive amplifiers 20 are shown as operational amplifiers with capacitive feedback, and may be formed as monolithic silicon integrated circuits, separate from the substrate on which the array 10 and column multiplexer switches 32 may be formed by thin film circuitry. Thus, the common terminals 34 may be the output terminal of the array substrate. Similarly, the row driver circuit 30 may be formed as a monolithic silicon integrated circuit, so that the connections between the row driver circuit 30 and the row conductors 14 may also be output terminals of the array substrate. It may also be possible to form at least part of the row driver circuit 30 and/or charge sensitive amplifiers 20 in thin film circuitry, which may therefore be formed on the same substrate as the array 10.

The use of operational amplifiers as the charge measurement circuits results in the input terminal to the charge sensitive amplifier 40 having a fixed potential. The problem therefore arises that if there is a voltage mismatch between the output of the multiplexer switches 32 and the input of the charge sensitive amplifier 40, a flow of charge may occur which gives rise to errors in the amplifier output. This voltage mismatch is the difference between the isolated output voltage of the switches 32 when no signal is present at the input, and the input voltage of the amplifier 40.

Although capacitive feedback is shown, which results in an integrating amplifier, it is equally possible to employ an amplifier having a high resistance feedback path, which then acts as a current to voltage converter, providing a voltage output indicative of the current signal. It is possible to implement the current compensation according to the invention, regardless of the specific amplifier used.

The presence of a voltage mismatch will depend upon the form of the multiplexer switches, and will be explained further in the following.

FIG. 2 shows a charge measurement circuit 20 according to the invention and connected to a multiplexer switch 32. Of course, several such switches 32 will be connected to each charge measurement circuit 20, for example as shown in FIG. 1.

The multiplexer switch 32 shown in detail in FIG. 2 has been devised by the applicant and is formed exclusively from diodes, enabling the switches 32 to be formed on the same substrate, and using the same thin film layers as diode-based pixels 12, such as shown in FIG. 1. This results in each common terminal 34 forming the interface between the measurement circuitry 20 and the substrate of the array 10. The charge measurement circuit 20 of the invention is particularly applicable to an image sensor including a multiplexer circuit 33 comprising multiplexer switches 32 such as shown in FIG. 2. The multiplexer switch 32 will therefore be described in the following.

Each switch 32 comprises a diode bridge formed from diodes 50 to 53, arranged in the form of two arms each extending between a supply node 54 and a drain node 56 of the diode bridge. Each arm comprises a pair of the diodes 50 to 53 connected in series and having the same polarity as each other between the supply node 54 and the drain node 56. The column conductor 16 is connected to one arm at the point of connection of diodes 50 and 51, and the output of the diode bridge, which is connected to the common terminal 34, is connected to the other arm at the point of connection of diodes 52 and 53. Control lines 37A and 37B are provided for supplying switching voltages to switch the diodes 50 to 53 of the diode bridge between forward bias in a first state of the bridge, and reverse bias in a second state of the bridge. In this way, a signal is transmitted between the column conductor 16 and the common terminal 34 in the first state of the bridge, and is not transmitted in the second state of the diode bridge.

The first control line 37A is connected to the supply node 54 through a supply diode 58, and the drain node 56 is connected to the second control line 37B through a drain diode 60.

When the multiplexer switch 32 is in the first state (switched on) then the common terminal 34 will be held at the mid point of the voltage control lines 37A, 37B, assuming that all diodes of the switch are equal, and there is no input from the column conductor 16. The voltage levels on the control lines 37A, 37B are, for example, selected to have equal magnitude and opposite sign, so that the output of the multiplexer switch 32 would be at 0 Volts when connected to an infinite impedance. This is the isolated output voltage of the switch 32 when there is no input. For correct operation of the circuit, this voltage corresponds to the voltage at which the common terminal 34 is held by the charge sensitive amplifier 40, and therefore no charge flows between the charge sensitive amplifier 40 and the multiplexer switch 32, which could give rise to false output signals of the measurement circuit 40.

In practice, voltages applied to the voltage control lines 37A, 37B will have offset values giving rise to a different isolated output voltage level for no input. Similarly, differences in the diodes forming the multiplexer switch 32 will give rise to a different voltage level at the common terminal 34. Of course, the same arguments apply to the charge sensitive amplifier 40. Thus, any input offset voltage of the amplifier 40 will also give rise to a voltage mismatch between the amplifier 40 and the multiplexer switch 32. The aim of the present invention is to eliminate the effects of this voltage mismatch.

Although a multiplexer switch has been represented in FIG. 2, the output of the multiplexer switch may simply be considered as the output of a charge supplying circuit, and the aim of the invention is to eliminate the effects of any voltage mismatch between this output and the input of the charge measurement circuit 20.

The charge measurement circuit 20 of the invention has an input 42 to which the common terminal 34 is connected, and this input 42 comprises the input to a charge sensitive amplifier 40. As is conventional, the charge sensitive amplifier 20 comprises an operational amplifier 21 having capacitive feed back through a capacitor 22. However, the charge sensitive amplifier 40 of the invention includes a switch 23 enabling the capacitive feedback to be disconnected. A resetting switch 24 may also be provided which enables capacitor 22 to be discharged as an initial resetting operation.

A compensation circuit 70 is provided comprising a voltage controlled current source shown in the form of field effect transistor 72 having a controllable gate voltage. A voltage is supplied to the gate of the transistor 72 by a track and hold circuit 74 which receives, as its input, the inverted output voltage of the charge sensitive amplifier 40. This inversion is effected by means of an amplifier 76 with a gain of −1.

The voltage controlled current source of the compensation circuit 70 is connected to the input 42 of the charge sensitive amplifier 20 and thereby acts as a current drain preventing the flow of charge to the charge sensitive amplifier 40 in certain circumstances. The output of the charge sensitive amplifier 40 is connected to a sample and hold circuit 78 enabling subsequent processing of the measured charge signal.

The transistor 72 has its drain connected to a negative potential so that as the track and hold circuit 74 provides a greater voltage, the gate to drain voltage of the transistor 72 increases, thereby increasing the source to drain current.

The circuit shown in FIG. 2 has two modes of operation, a calibration mode and a charge measurement mode. During the calibration mode, the current required to be drained from the input 42 of the charge sensitive amplifier 40 is determined. For this purpose, the multiplexer switch 32 is turned on and no input is received from the column conductor 16. To achieve this, none of the rows of pixels are selected for charge measurement. Switches 23 and 24 of the charge sensitive amplifier 20 are both open so that the amplifier is open loop. In this case, the amplifier 21 effectively amplifies the voltage mismatch between the inverting input of the amplifier 21 and the output of the multiplexer switch 32. For example, if either of the control lines 37A, 37B has a positive voltage offset, then when the multiplexer switch 32 is turned on, the inverting input of the amplifier 21 will be driven to a potential greater than 0 Volts. This will drive the output of the amplifier to a negative value (which may or not be saturated). During this time, the track and hold circuit 34 is in a tracking mode, and the output of the inverting amplifier 76 results in a positive voltage being applied to the gate of the transistor 72. This forces the voltage controlled current source to draw a current from the output of the multiplexer 32 (namely from the common terminal 34) as shown by the arrow 79 in FIG. 2. This flow of current causes the voltage at the inverting input of the amplifier 21 to be reduced. The system thus operates as a negative feed-back loop. With appropriate gain and frequency considerations this negative feed-back loop will stabilize when the potential of the amplifier inverting input is equal to that of the non-inverting input, namely at ground potential. Once this is achieved, within a predetermined time period, the voltage-controlled current source will be providing the appropriate flow of current 79 to overcome any offsets in the voltage control lines 37. Similarly, any input offset voltage of the amplifier 21 is also compensated, as is any voltage mismatch resulting from non-identical diode characteristics of the diodes in the multiplexer switch 32. Once the compensation current has stabilized, the track and hold circuit switches into hold mode, so that the voltage-controlled current source subsequently provides this constant offset current. In this state, no current is supplied to the inverting input of the amplifier 21 and consequently any subsequent flow of charge to the amplifier 21 is representative of charge introduced by the column conductor 16.

After the track and hold circuit has been switched to hold mode, the measuring circuit 40 may be operated in the charge measurement mode. Thus, switch 23 is closed to complete the capacitive feedback loop of the amplifier 21 and the appropriate row pulse is applied to a row of pixels of the array 10. This causes a charged flow down the column conductor 16 as represented by the current source 35 in FIG. 2. The switch 24 may temporarily be closed initially to ensure that the capacitor 22 is discharged.

Following the end of the row select pulse, which enables the charge from the row of pixels to pass to the respective columns, the sample and hold circuit 78 connected to the output of the charge sensitive amplifier 21 stores the amplifier output. Switch 24 can then be closed as a precaution to prevent unnecessary amplifier saturation.

When the invention is applied to an image sensor which includes multiplexer outputs, such as shown in FIG. 1, the compensation stage needs to be carried out for each multiplexer switch rather than solely for each amplifier. This is necessary because the level of compensation current will be different for each multiplexer switch 32, which is controlled by different voltage control lines and is fabricated from different circuit components. Thus, different offset values will arise for each column of pixels.

To implement compensation for each column multiplexer switch, it is possible either:

(i) to read all pixels in a column (or set of columns) one after the other, using a single multiplexer switch of each amplifier, and then to switch to a different column (or set of columns), or (ii) to read all pixels in a row before proceeding to the following row, thereby sequentially turning on the multiplexer switches for each row.

Technique (i) requires one compensation measurement for each column of pixels, but requires a number of cycles of row pulses. Technique (ii) requires a compensation measurement for each pixel but only requires one cycle of row pulses.

It is not impractical to include a compensation stage for each pixel measurement, because a reset pulse (closing switch 24) may precede each charge measurement, and the compensation calibration may follow this reset operation of the charge sensitive amplifier.

The operation of the circuit of FIG. 2 assumes that the offset voltages of the charge sensitive amplifier 20 or the voltage control lines 37 result in an overall positive offset, so that current needs to be drained from the common terminal 34 in order to match the output of the multiplexer switch with the inverting input of the amplifier 21. This positive offset is compensated using the voltage controlled current source connected to a negative potential as shown in FIG. 2. However, in practice, the voltage offsets could be either positive or negative, and differences between the diodes forming the multiplexer switch 32 could equally give rise to a positive or negative offset of the switch. The circuit of FIG. 2 can only drain current from the common terminal 34. One way to ensure that the voltage mismatch will require current draining is to set the voltages accordingly. For example, the non inverting input of the amplifier 21 could be held at a potential below ground, for example at a voltage which corresponds to the maximum possible offset below ground potential. However, compensation for a negative offset of the multiplexer switch 32 may instead be compensated by enabling current to be driven into the diode bridge output.

The circuit shown in FIG. 3 provides a voltage-controlled current push/pull capability to be able to handle both positive and negative offsets. The circuit corresponds to that of FIG. 2, and the operation is identical. However, there is an additional current source 80 which provides a fixed biased current flowing into the amplifier input. If the bridge offset is positive, then the current at the voltage-controlled current source is greater than the bias current provided by current source 80, so current is being drawn out of the bridge. Conversely, if the offset is negative, the circuit stabilizes to an operating point where the current in the voltage-controlled current source is less than the bias current provided by the current source 80, so that the current is being forced into the bridge.

Those skilled in the art will appreciate the possible implementations for the track and hold circuit, and for the constant current source. These components may all be fabricated on a substrate separate to that of the array 10 of pixels, and therefore do not need to be formed using the same technology as for the pixel array. These components are all suitable for integration in a column driver circuit, and do not result in an increase in the number of connections between the array substrate and the peripheral circuitry. It will be appreciated by those skilled in the art that various modifications may be effected to the compensation circuit, provided the basic requirement of generating a bias current is met.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A charge measurement circuit for measuring the charge flowing from the output of a charge supplying circuit to an input of the charge measurement circuit, the measurement circuit including a charge sensitive amplifier which holds the input to a predetermined substantially constant voltage and compensation means for supplying a compensation current to or draining a compensation current from the input, the compensation current being selected such that charge flowing as a result of a voltage mismatch between the output of the charge supplying circuit and the input of the charge measurement circuit is provided by the compensation means.

2. A charge measurement circuit as claimed in claim 1, wherein the compensation means comprises a voltage-controlled current source.

3. A charge measurement circuit as claimed in claim 2, wherein the measurement circuit has two modes of operation, a first mode in which the output of the charge sensitive amplifier is representative of the voltage mismatch and is used to generate a voltage control signal for the voltage-controlled current source, and a second mode in which the voltage control signal is applied to the voltage controlled current source and the output of the charge sensitive amplifier is representative of the charge flowing to the input.

4. A charge measurement circuit as claimed in claim 3, wherein the charge sensitive amplifier comprises an amplifier with capacitive feedback which can be selectively applied, the capacitive feedback being disconnected in the first mode so that the charge sensitive amplifier operates as an open loop voltage amplifier, and the capacitive feedback being connected in the second mode so that the charge sensitive amplifier operates to measure the flow of charge.

5. A charge measurement circuit as claimed in claim 3, wherein the compensation means comprises a transistor having a gate voltage which is controlled using the voltage control signal.

6. A charge measurement circuit as claimed in claim 5, wherein the compensation means further comprises a track and hold circuit for holding the voltage control signal on the gate during the second mode of the charge measurement circuit.

7. A charge measurement circuit as claimed in claim 1, wherein the charge supplying circuit comprises a plurality of columns of pixels of an image sensor array, each column being connected to the input of the measurement circuit through a respective multiplexer switch so that charge supplied by an individual column of pixels can be supplied to the measurement circuit through the respective multiplexer switch.

8. A charge measurement circuit as claimed in claim 7, wherein the multiplexer switch comprises a diode bridge which is controlled by voltages applied to control terminals of the diode bridge.

9. An image sensor comprising an array of pixels arranged in rows and columns and a column multiplexer circuit comprising a plurality of switches, a switch being associated with each column, the image sensor further comprising a charge measurement circuit as claimed in claim 1 associated with a plurality of switches.

* * * * *